United States Patent
Tsuno

(10) Patent No.: US 8,063,412 B2
(45) Date of Patent: Nov. 22, 2011

(54) SEMICONDUCTOR DEVICE WITH DUMMY PATTERN WITHIN ACTIVE REGION AND METHOD OF MANUFACTURING THE SAME

(75) Inventor: Hitoshi Tsuno, Tokyo (JP)

(73) Assignee: Sony Corporation, Tokyo (JP)

( * ) Notice: Subject to any disclaimer, the term of this patent is extended or adjusted under 35 U.S.C. 154(b) by 179 days.

(21) Appl. No.: 12/268,506

(22) Filed: Nov. 11, 2008

(65) Prior Publication Data

US 2009/0127634 A1 May 21, 2009

(30) Foreign Application Priority Data

Nov. 15, 2007 (JP) ................................. 2007-296295

(51) Int. Cl.
H01L 29/74 (2006.01)
H01L 31/111 (2006.01)
(52) U.S. Cl. .. 257/173; 257/202; 257/355; 257/E29.014
(58) Field of Classification Search .................. 257/173, 257/202, 337, 338, 355, 368, 369, E29.014
See application file for complete search history.

(56) References Cited

U.S. PATENT DOCUMENTS 6,835,623 B2 * 12/2004 Shiau et al. .................... 438/286
2009/0289284 A1 * 11/2009 Goh et al. ...................... 257/288

FOREIGN PATENT DOCUMENTS

| JP | 07-201858 | 8/1995 |
|---|---|---|
| JP | 08-236767 | 9/1996 |
| JP | 08-288295 | 11/1996 |
| JP | 10-200109 | 7/1998 |
| JP | 11-214634 | 8/1999 |
| JP | 2002-190589 | 7/2002 |
| JP | 2004-289138 | 10/2004 |
| JP | 2007-123442 | 5/2007 |
| JP | 2006-278952 | 11/2009 |

OTHER PUBLICATIONS

Paul Grudowski et al.; 1-D and 2-D Geometry Effects in Uniaxially-Strained Dual Etch Stop Layer Stressor Integrations, 2006.
H. Tsuno et al.; Advanced Analysis and Modeling of MOSFET Characteristic Fluctuation Caused by Layout Variation, 2007.
Japanese Patent Office Action corresponding to Japanese Serial No. 2007-296295 dated Oct. 6, 2009.

* cited by examiner

Primary Examiner — Hoai V Pham
(74) Attorney, Agent, or Firm — SNR Denton US LLP

(57) ABSTRACT

A semiconductor device includes a semiconductor substrate having an active region, a plurality of gate electrodes formed on the active region with a gate insulating film therebetween, and a dummy pattern formed on the active region in at least a part thereof between the gate electrodes. The dummy pattern is formed so that a spacing between gate electrodes adjacent to each other, and a spacing between the dummy pattern and the gate electrodes adjacent to the dummy pattern, are within predetermined ranges.

6 Claims, 12 Drawing Sheets

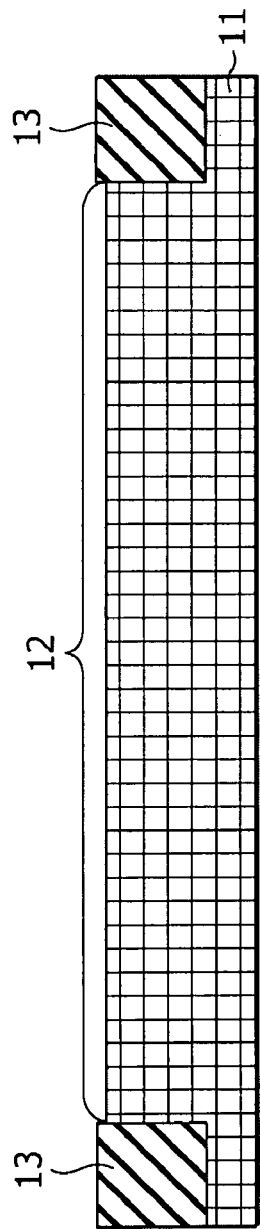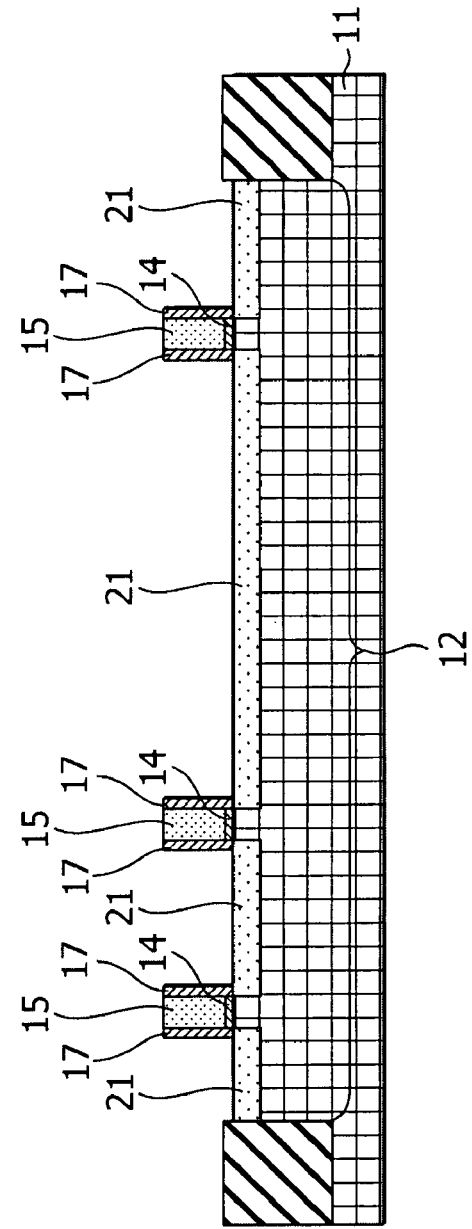
FIG. 7A
FIG. 7B

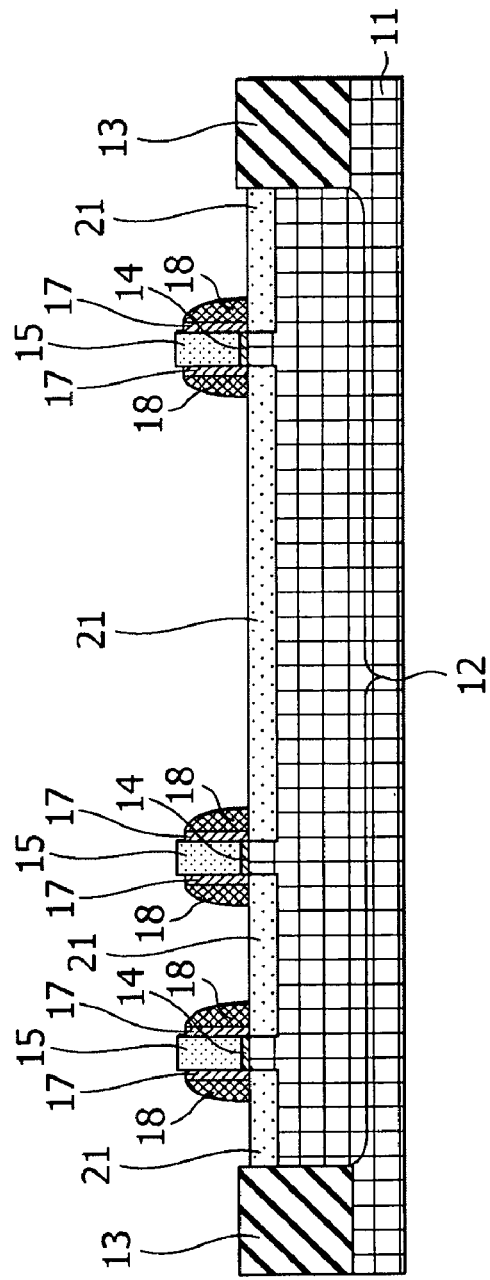
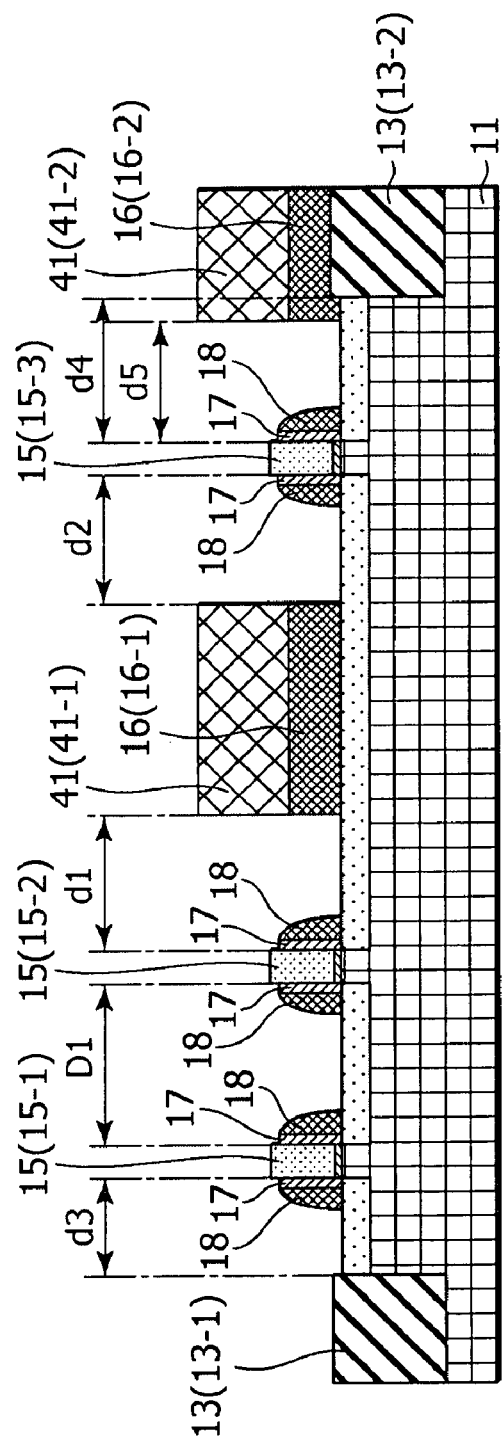
FIG. 8A
FIG. 8B

SEMICONDUCTOR DEVICE WITH DUMMY PATTERN WITHIN ACTIVE REGION AND METHOD OF MANUFACTURING THE SAME

CROSS-REFERENCE TO RELATED APPLICATIONS

The present application claims benefit of priority of Japanese patent Application No. 2007-296295 filed in the Japanese Patent Office on Nov. 15, 2007, the entire disclosure of which is incorporated herein by reference.

BACKGROUND OF THE INVENTION

1. Field of the Invention

The present invention relates to a semiconductor device having gate electrodes, and a method of manufacturing the same.

2. Description of Related Art

General LSIs using FETs are designed in various ways, by using arbitrary values to a gate-to-gate spacing within the scope of design rules.

However, with progress of shrinkage of elements, it has been known that difference in the gate spacing might affect gate length, impurity distribution, carrier mobility and so forth, and might systematically vary transistor characteristics (see P. Grudowski et al., "1-D and 2-D Geometry Effects in Uniaxially-Strained Dual Etch Stop Layer Stressor Integrations", Symp. on VLSI Tech., p. 76 (2006) (Non-Patent Document 1) and H. Tsuno et al., "Advanced Analysis and Modeling of MOSFET Characteristic Fluctuation Caused by Layout Variation" Symp. on VLSI Tech., p. 204 (2007) (Non-Patent Document 2).

Transistors having diffusion layers at the ends of the active region may make the gate spacing closer to a constant value, by forming a dummy gate on the element isolation region.

However, for transistors having no diffusion layers at the ends of the active region, it is difficult to provide the dummy gate without careful consideration, from the viewpoint of element isolation, On the other hand, adding constraints to the design of gate spacing may limit the degree of freedom of design, which leads to reduce the competitiveness.

A semiconductor device having, as shown in FIG. 9, dummy gates 116 on both ends of a transistor 103, which has a shape to straddle a diffusion layer 122 and an element isolation region 113, has been proposed (see Japanese Unexamined Patent Application Publication No. H8-236767 (Patent Document 1), for example).

It has been reported that, by forming the dummy gates 116 which straddles the diffusion layers 122 and the element isolation regions 113 in this way, variation in the gate length ascribable to gate spacing can be reduced, so that variation in the transistor characteristics may be suppressed.

This configuration is, however, applicable only to transistors having the diffusion layers at the ends of the active region, and is not readily applicable to target transistor having additional transistor(s) formed on one side, or on both sides thereof.

A semiconductor device having, as shown in FIG. 10, dummy gates 216, 217 on the diffusion layers 222 on both ends of a transistor 203, or on the element isolation region 213 has been proposed (see Japanese Unexamined Patent Application Publication No. 2002-190589 (Patent Document 2), for example).

It has been reported that, by forming the dummy gates 216, 217 on the diffusion layers 222 on both ends of a transistor 203, or on the element isolation region 213 in this way, variation in the sidewall width ascribable to gate spacing can be reduced, so that the variation in the transistor characteristics can be suppressed.

In the exemplary case of Patent Document 2, the configuration is also employed to the transistor having no diffusion layers formed at the ends of the active region. Formation of the dummy gates in the active region may, however, make the diffusion layer divided into regions on the left sides and the right sides of the dummy gates, so that, in a practical MOS transistor circuit, the dummy gates may be formed only to limited transistors, similarly to the transistor described in the Patent Document 1.

A semiconductor device having, as shown in FIG. 11, dummy gates 316 on the element isolation regions 313 in the vicinity of transistors 303, and a semiconductor device having, as shown in FIG. 14, dummy patterns 317 on the element isolation regions 313 in the vicinity of the transistors 303 have been proposed [see Japanese Unexamined Patent Application Publication No. 2004-289138 (Patent Document 3), for example].

It has been reported that, by forming the dummy gates 316 or the dummy patterns 317 in this way, thickness of a silicide layer 325 on the diffusion layer 322 can be made uniform, so that the variation in the transistor characteristics can be suppressed.

The configuration of forming the dummy gates on the element isolation regions is, however, all the same with that described in the Patent Document 2, and is applicable again only to a limited transistors. Although the configuration is different from that of the Patent Document 2 in that not only the dummy gates but also the dummy patterns are used, the dummy gates or the dummy patterns are formed still on the element isolation region, so that a problem remains in that the configuration is applicable only to a limited transistors which reside at the ends of the active region.

SUMMARY OF THE INVENTION

One drawback in the known proposal is transistors formed at limited positions, wherein the transistors are capable of forming the dummy patterns or dummy gates.

Accordingly, it is desirable to form a dummy pattern to any transistors formed anywhere, to thereby enable reduction of variation in the transistor characteristics.

In accordance with one embodiment of the present invention, there is provided a semiconductor device which includes a semiconductor substrate having an active region, a plurality of gate electrodes formed on the active region with a gate insulating film therebetween, and a dummy pattern formed on the active region in at least a part thereof between the gate electrodes. The dummy pattern is formed so that a spacing between the gate electrodes adjacent to each other, and a spacing between the dummy pattern and the gate electrodes adjacent to the dummy pattern, are within predetermined ranges.

In the semiconductor device according to the embodiment, the dummy pattern is formed in the active region in at least a part thereof between the gate electrodes, and is formed so that a spacing between the gate electrodes adjacent to each other, and a spacing between the dummy pattern and the gate electrodes adjacent to the dummy pattern, are within predetermined ranges even if the spacing between gate electrodes very. Consequently, the spacing between the dummy pattern and the gate electrodes adjacent to the dummy pattern falls in a predetermined range, whereby the spacing between the adjacent gate electrodes, and the spacing between the dummy pattern and the gate electrodes adjacent to the dummy pattern are kept almost constant.

As a consequence, the diffusion layer, silicide layer, a stress liner film for applying stress to the semiconductor substrate, and the like are uniformly formed between the gate electrodes, and between the dummy pattern and the gate electrodes.

In accordance with another embodiment of the present invention, there is provided a method of manufacturing a semiconductor device (first manufacturing method) which includes the steps of: forming a plurality of gate electrodes on an active region of a semiconductor substrate with a gate insulating film interposed therebetween; forming a sidewall forming film on the semiconductor substrate to cover the gate electrodes; forming an etching mask on the sidewall forming film in at least a part thereof between the gate electrodes; and forming a dummy pattern on the active region in at least a part thereof between the gate electrodes while forming sidewalls on both side faces of the gate electrodes by etching back the sidewall forming film through the etching mask. The etching mask is formed so that a spacing between the gate electrodes adjacent to each other, and a spacing between the dummy pattern and the gate electrodes adjacent to the dummy pattern, are within predetermined ranges.

In the method of manufacturing a semiconductor device according to another embodiment of the present invention (first manufacturing method), the etching mask is formed so that a spacing between the gate electrodes adjacent to each other, and a spacing between the dummy pattern and the gate electrodes adjacent to the dummy pattern, are within predetermined ranges. Consequently, the dummy pattern is formed on the active region in at least a part thereof between the gate electrodes so that the spacing between the gate electrodes adjacent to each other, and the spacing between the dummy pattern and the gate electrodes adjacent to the dummy pattern, are within predetermined ranges. As a consequence, the spacing between the gate electrodes, and the spacing between the dummy pattern and the gate electrodes are kept almost constant. Accordingly, the diffusion layer, silicide layer, a stress liner film for applying stress to the semiconductor substrate, and the like can uniformly be formed between the gate electrodes, and between the dummy pattern and the gate electrodes.

In accordance with a further embodiment of the present invention, there is provided another method of manufacturing a semiconductor device (second manufacturing method) which includes the steps of: forming a plurality of gate electrodes on an active region of a semiconductor substrate with a gate insulating film interposed therebetween; forming a sidewall forming film on the semiconductor substrate to cover the gate electrodes, and then etching back the sidewall forming film to thereby form sidewalls on the side faces of the gate electrodes; forming an insulating film on the semiconductor substrate having the sidewalls formed thereon; forming an etching mask on the insulating film in at least a part thereof between the gate electrodes; and etching the sidewall forming film by using the etching mask, to thereby form a dummy pattern on the active region in at least a part thereof between the gate electrodes. The etching mask is formed so that a spacing between the gate electrodes adjacent to each other, and a spacing between the dummy pattern and the gate electrodes adjacent to the dummy pattern, are within predetermined ranges.

In the method of manufacturing a semiconductor device according to the further embodiment of the present invention (second manufacturing method), the etching mask is formed so that the spacing between the gate electrodes adjacent to each other, and the spacing between the dummy pattern and the gate electrodes adjacent to the dummy pattern are within predetermined ranges. As a result, the dummy pattern is formed on the active region in at least a part thereof between the gate electrodes, and is formed so that the spacing between the gate electrodes adjacent to each other, and the spacing between the dummy pattern and the gate electrodes adjacent to the dummy pattern are within predetermined ranges. As a consequence, the spacing between the gate electrodes, and the spacing between the dummy pattern and the gate electrodes are kept almost constant. Accordingly, the diffusion layer, silicide layer, a stress liner film for applying stress to the semiconductor substrate, and the like are uniformly formed between the gate electrodes, and between the dummy pattern and the gate electrodes.

According to embodiments of the present invention, since the spacing between the gate electrodes, and the spacing between the dummy pattern and the gate electrodes are almost constant, the diffusion layer, silicide layer, a stress liner film for applying stress to the semiconductor substrate, and the like are uniformly formed. As a result, the semiconductor device according to embodiments of the present invention is advantageous in that characteristics of transistors each having gate electrode may be kept constant.

In short, a variation in transistor characteristics ascribable to the gate-to-gate spacing can be suppressed.

In a method of manufacturing a semiconductor of embodiments of the present invention (first and second manufacturing methods), since the spacing between the gate electrodes, and the spacing between the dummy pattern and the gate electrodes are formed almost constant, the diffusion layer, silicide layer, a stress for applying stress to the semiconductor substrate, and the like are uniformly formed. As a result, the methods are advantageous in that characteristics of transistors each having the gate electrode may be made constant.

In short, a variation in transistor characteristics ascribable to the gate-to-gate spacing can be suppressed.

The above summary of the present invention is not intended to describe each illustrated embodiment or every implementation of the present invention. The figures and the detailed description which follow more particularly exemplify these embodiments.

BRIEF DESCRIPTION OF THE DRAWINGS

FIGS. 7A to 7E are sectional views showing steps of the first method of manufacturing a semiconductor device according to one embodiment of the present invention;

FIGS. 8A and 8B are sectional views showing steps of the second method of manufacturing a semiconductor device according to one embodiment of the present invention.

DETAILED DESCRIPTION OF EMBODIMENTS

Figure 1:
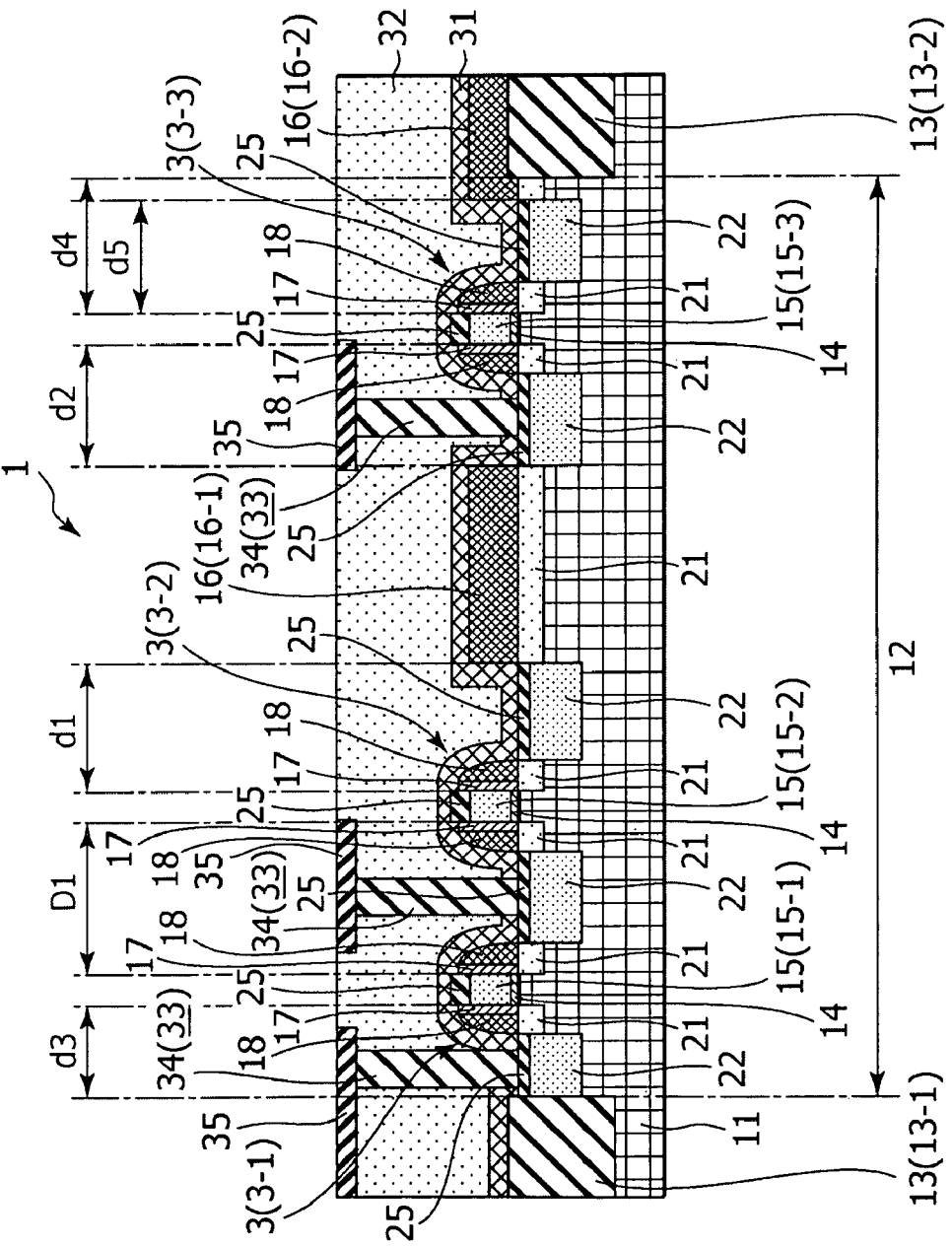
FIG. 1 is a schematic sectional view showing a configuration of the semiconductor device according to one embodiment (first embodiment) of the present invention.

One embodiment (first embodiment) of the semiconductor device according to an embodiment of the present invention will be explained, referring to FIG. 1 showing a schematic sectional view of a configuration thereof.

As shown in FIG. 1, element isolation regions 13 defining active regions 12, are formed in a semiconductor substrate 11. In each active region 12, plurality of field effect transistors 3 (3-1, 3-2, 3-3) are formed.

More specifically, a plurality of gate electrodes 15 are formed in the active region 12 with a gate insulating film 14 therebetween. An example shown herein has three gate electrodes 15 (15-1 to 15-3). For example, the plurality of gate electrodes 15 are formed so that the spacing D1 between the gate electrode 15 (15-1) and the gate electrode 15 (15-2) differs from the spacing D2 between the gate electrode 15 (15-2) and the gate electrode 15 (15-3).

In at least a part between the gate electrodes 15, which are the gate electrode 15-2 and the gate electrode 15-3 herein, there is formed a dummy pattern 16.

The dummy pattern 16 is formed so that the spacing D1 between the gate electrode 15-1 and the gate electrode 15-2 which are adjacent to each other, the spacing d1 between the dummy pattern 16 (16-1) and the gate electrode 15-2 which is one of the adjacent gate electrodes, and the spacing d2 between the dummy pattern 16 (16-1) and the gate electrode 15-3 which is the other of the adjacent gate electrodes, are within predetermined ranges.

The term "predetermined ranges" as used herein means that, for example, when the spacing d2 is compared to the spacing D1 between the gate electrode 15-1 having no dummy pattern 16 and the gate electrode 15-2, d2=D1, or d2=D1±δ (δ represents an allowable value of difference in spacing allowable in the case of different spacings). The term "predetermined ranges" will be used in this meaning hereinafter.

For the case where the spacing D1 between the gate electrodes differs from the spacing d3 between the element isolation region 13 (13-1) and the gate electrode 15-1, or from the spacing d4 between the gate electrode 15-3 and the element isolation region 13 (13-2), it is preferable to provide a dummy pattern 16-2 also on the element isolation region side. In this embodiment, the spacing d3 with respect to the spacing D1 is within a predetermined range, but the spacing d4 is not within the range.

Accordingly, the dummy pattern 16 (16-2) is formed on the element isolation region 16 (16-2) side.

As a consequence, the spacing d5 between the gate electrode 15-3 and the dummy pattern 16-2 with reference to the spacing D1 is given as d5=D1, or d5=D1±δ.

Sidewalls 18 are formed on the side faces of each gate electrode 15 with an offset spacer 17 interposed therebetween. The sidewalls 18 and the dummy pattern 16 may be formed by using the same sidewall forming film. The gate electrodes 15 preferably have a hard mask layer (not shown) formed on the upper portion thereof. The formation of the hard mask layer may prevent the gate electrodes 15 from being etched, when the offset spacer 17, the sidewall 18 and the like are formed.

Source/drain regions 22, which are diffusion layers having impurities introduced therein by an impurity introducing technique such as ion implantation, are formed on the semiconductor substrate 11 on both sides of the respective gate electrodes 15 with LDD regions 21 therebetween.

A metal silicide layer 25 is formed on each gate electrode 15, the metal silicide layer 25 is also formed on each source/drain region 22. The metal silicide layer 25 is, for example, composed of a metal silicide such as cobalt silicide, nickel silicide and the like.

On the semiconductor substrate 11, an etching stopper film 31, which causes an etching for forming contact holes connected later to stop temporarily, is formed so as to cover the gate electrodes 15, the dummy pattern 16, the sidewalls 18 and the like.

The etching stopper film 31, composed of a silicon nitride film having a tensile stress, or composed of a silicon nitride film having a compressive stress, may be used also as a stress liner film for applying stress to channel regions formed in the semiconductor substrate 11 under the respective gate electrodes 15.

On the semiconductor substrate 11, an insulating interlayer 32 is formed so as to cover the etching stopper film 31. The insulating interlayer 32 has contact holes 33 connecting to the metal silicide layers on the source/drain regions 22, and to the metal silicide layers 25 on the gate electrodes 15. The drawing shows, as an example, a part of contact holes 33 connecting to the metal silicide layers 25 on the source/drain regions 22. In the contact holes 33, plugs 34 are formed to fill the inside thereof. The plugs 34 are connected to interconnects 35 formed on the insulating interlayer 32.

In the semiconductor device 1 according the embodiment, even if the spacing between the gate electrodes 15 may vary, the dummy pattern 16-1 is formed in the active region 12 in at least a part thereof between the gate electrodes 15-2 and 15-3, so that the spacing between the gate electrodes 15-1 and 15-2 which are adjacent each other, and the spacings between the dummy pattern 16-1 and the gate electrodes 15-2 and 15-3 each of which are adjacent to the dummy pattern 16-1 are within the predetermined ranges. As a result, the spacing between the gate electrodes 15-1 and 15-2 which are adjacent to each other, and the spacings between the dummy pattern 16-1 and the gate electrodes 15-1 and 15-2 each of which are adjacent to the dummy pattern 16-1 may be almost constant. As a consequence, amount of point defect, produced in the source/drain regions 22 composed of diffusion layers in the process of introducing impurities between the gate electrodes 15-1 and 15-2, and between the dummy pattern 16-1 and each of the gate electrodes 15-2 and 15-3, may become closer to a constant level.

On the other hand, difference in the spacing between gate electrodes 15 results in difference in area of the source/drain regions 22 therebetween. The source/drain region 22 formed in a region between largely-spacing gate electrodes 15 have a larger area than the source/drain region 22 formed in a region between shortly-spacing gate electrodes 15, so that an amount of point defect density increases as an area of the source-drain region increases, if the density of point defect possibly produced in the source/drain regions 22 in the process of formation thereof is assumed as equivalent.

Such difference in the amount of point defect may cause a change in transient accelerated diffusion of the impurities in the succeeding thermal processes.

Accordingly, the impurity profile of the source/drain regions 22 is changed, so that the transistor characteristics are changed.

For this reason, there is a demand of making the area of the source/drain region 22 constant.

In other words, it is required to keep the spacing between the gate electrodes 15 constant.

Alternatively, the formation of the dummy pattern 16 as in an embodiment of the present invention makes thickness of the metal silicide layers 25 formed on the source/drain regions 22 constant.

Another advantage is that the stress applied by the etching stopper film 31, which functions as a stress liner film for applying stress to the semiconductor substrate 11, is made constant.

On the other hand, as described above, the difference in the spacing between the gate electrodes 15 results in difference in the area of the source/drain regions 22 between the gate electrodes 15. The source/drain region 22 formed in a region between largely-spacing gate electrodes 15 have a larger area than the source/drain region 22 formed in a region between shortly-spacing gate electrodes 15, so that stress applied by the stress liner film formed on the source/drain regions 22 will more readily be applied to the channel region.

As a consequence, the channel region adjacent to a larger source/drain region 22 is applied with a larger stress (tensile stress or compressive stress) by the stress liner film, whereas the channel region adjacent to a smaller source/drain region 22 is applied with a smaller stress (tensile stress or compressive stress) by the stress liner film.

Accordingly, depending on the size of the source/drain regions 22, stress value applied to the channel regions adjacent thereto varies. This means that the transistor characteristics, in particular drive current, vary depending on the size of the source/drain regions 22, i.e., the spacing between gate electrodes 15.

For this reason, by forming the dummy pattern 16 as described above, so as to make the spacing between the adjacent gate electrodes 15, and the spacing between the gate electrodes 15 and the dummy pattern 16 adjacent to the gate electrodes 15 within predetermined ranges, characteristics of the transistors having the respective gate electrodes 15 can be made constant. In other words, the variation in characteristics of the transistor ascribable to the gate spacing can be suppressed.

Next, another embodiment (second example) of the semiconductor device of an embodiment of the present invention will be explained, referring to FIG. 2 which is a schematic sectional view showing a configuration thereof, and FIG. 3 which is a plan view showing a layout thereof.

Figure 2:
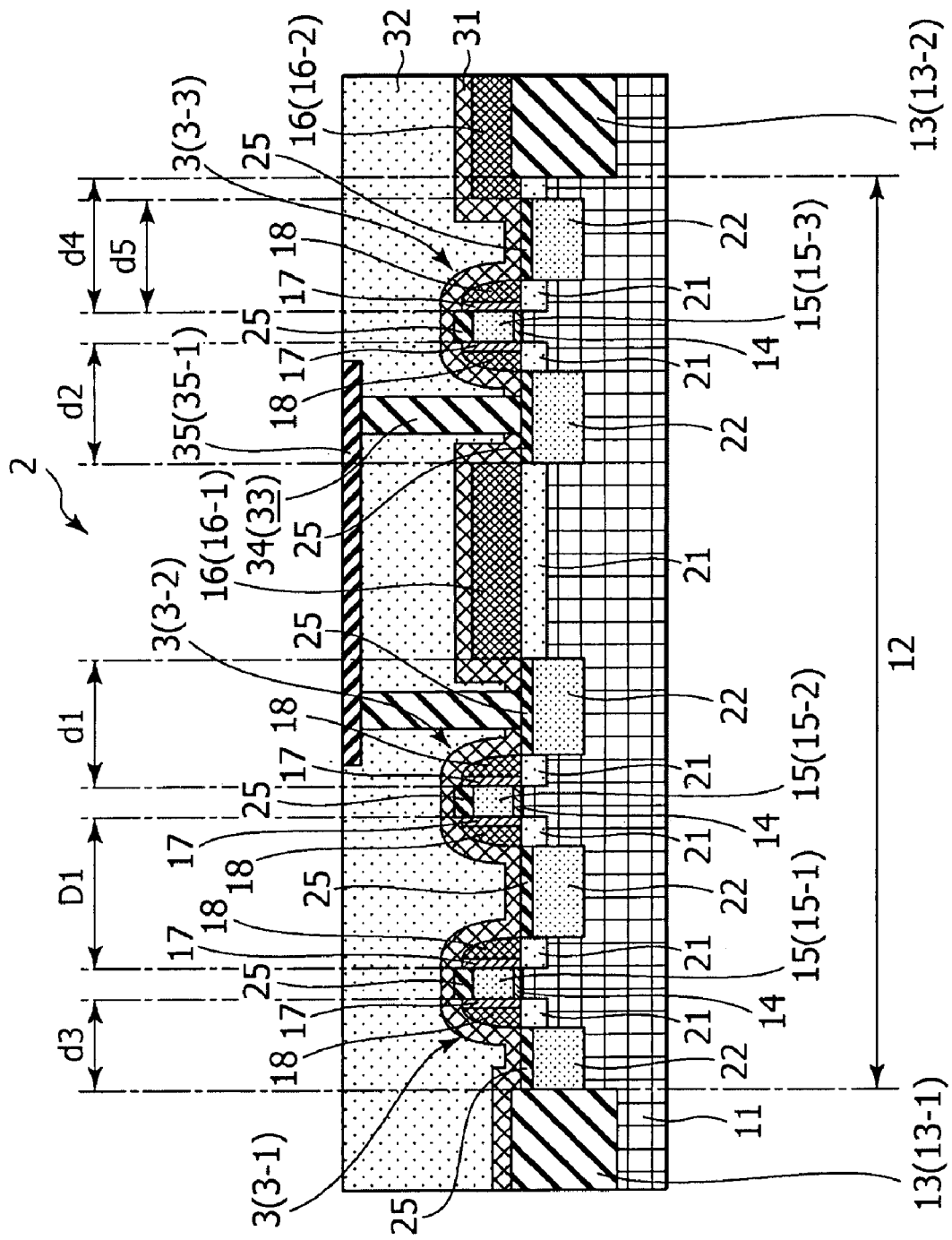
FIG. 2 is a schematic sectional view showing a configuration of the semiconductor device according to one embodiment (second embodiment) of the present invention.
Figure 3:
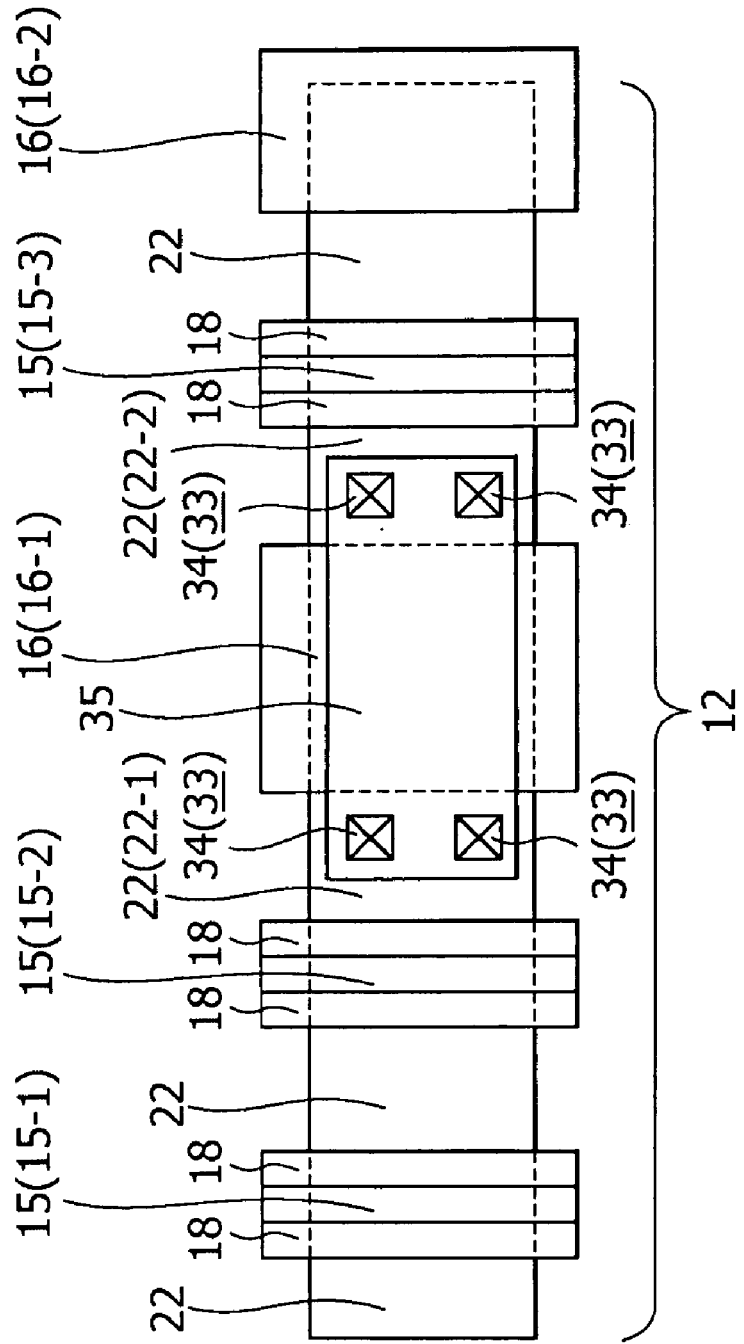
FIG. 3 is a plan view showing a layout of the semiconductor device according to one embodiment (second embodiment) of the present invention.

As shown in FIG. 2 and FIG. 3, and as in the case of explaining by referring to FIG. 1, the element isolation regions 13 defining the active regions 12 are formed in the semiconductor substrate 11, and in each active region 12, a plurality of field effect transistors 3 (3-1, 3-2, and 3-3) are formed.

More specifically, a plurality of gate electrodes 15 are formed on the active region 12 with the gate insulating film 14 interposed therebetween. An example shown herein has three gate electrodes 15 (15-1, 15-2, and 15-3). The plurality of gate electrodes 15 are formed, for example, so that the spacing D1 between the gate electrode 15 (15-1) and the gate electrode 15 (15-2) differs from the spacing D2 between the gate electrode 15 (15-2) and the gate electrode 15 (15-3).

In at least a part between the gate electrodes 15, which is between the gate electrode 15-2 and the gate electrode 15-3 herein, there is formed a dummy pattern 16.

The dummy pattern 16 is formed so that the spacing D1 between the gate electrode 15-1 and the gate electrode 15-2 which are adjacent to each other, the spacing d1 between the dummy pattern 16 (16-1) and the gate electrode 15-2 which is one of the adjacent gate electrodes, and the spacing d2 between the dummy pattern 16 (16-1) and the gate electrode 15-3 which is the other of the adjacent gate electrodes are within predetermined ranges.

The spacing d3 between the element isolation region 13 (13-1) and the gate electrode 15-1 is within a predetermined range with respect to the spacing D1 between the gate electrodes, whereas the spacing d4 between the gate electrode 15-3 and the element isolation region 13 (13-2) is not within the predetermined range.

For this reason, the dummy pattern 16 (16-2) is formed on the element isolation region 16 (16-2) side. As a consequence, the spacing d5 between the gate electrode 15-3 and the dummy pattern 16-2 with respect to the spacing D1 is given as d5=D1, or d5=D1±δ.

Sidewalls 18 are formed on the side faces of each gate electrode 15 with an offset spacer 17 interposed therebetween. The sidewalls 18 and the dummy pattern 16 may be formed by using the same sidewall forming film. The gate electrodes 15 preferably have a hard mask layer 19 formed on the upper portion thereof. The formation of the hard mask layer 19 may prevent the gate electrodes 15 from being etched, when the offset spacers 17, the sidewalls 18 and the like are formed.

Source/drain regions 22, which are diffusion layers having impurities introduced therein by an impurity introducing technique such as ion implantation, are formed on the semiconductor substrate 11 on both sides of the respective gate electrodes 15 with LDD regions 21 therebetween.

A metal silicide layer 25 is formed on each gate electrode 15, and the metal silicide layer 25 is also formed on each source/drain region 22 has a metal silicide layer 25. The metal silicide layer 25 is, for example, composed of a metal silicide such as cobalt silicide, nickel silicide and the like.

On the semiconductor substrate 11, the etching stopper film 31 is formed so as to cover the gate electrodes 15 and the dummy pattern 16. The etching stopper film 31, composed of a silicon nitride film having tensile stress, or composed of a silicon nitride film having compressive stress, may be used also as a stress liner film for applying stress to channel regions formed in the semiconductor substrate 11 under the respective gate electrodes 15.

Further, on the semiconductor substrate 11, an insulating interlayer 32 is formed to cover the etching stopper film 31. The insulating interlayer 32 has contact holes 33 (partially not shown) connecting to the source/drain regions 22, the gate electrodes 15 and so forth. The drawing shows, as an example, the contact holes 33 connecting to the source/drain regions 22 on both sides of a part of dummy pattern 16-1. In the contact holes 33, plugs 34 are formed to fill the inside thereof. The plugs 34 are connected to the interconnects 35 formed above the insulating interlayer 32.

In the second embodiment, the plugs 23, formed in the contact holes 33 connecting to the source/drain regions 22 on both sides of the dummy pattern 16-1, are connected by the interconnect 35 (35-1).

Thus, since the source/drain regions 22 (22-1, 22-2) on both sides of the dummy pattern 16-1 are connected through the plugs 34 by the interconnect 35-1, potential difference which may be generated between the source/drain regions 22

(22-1, 22-2) which are diffusion layers on both sides of the dummy pattern 16-1, can be suppressed.

Operations and effects similar to those in the first embodiment may be obtained also from the second embodiment.

Figure 4:
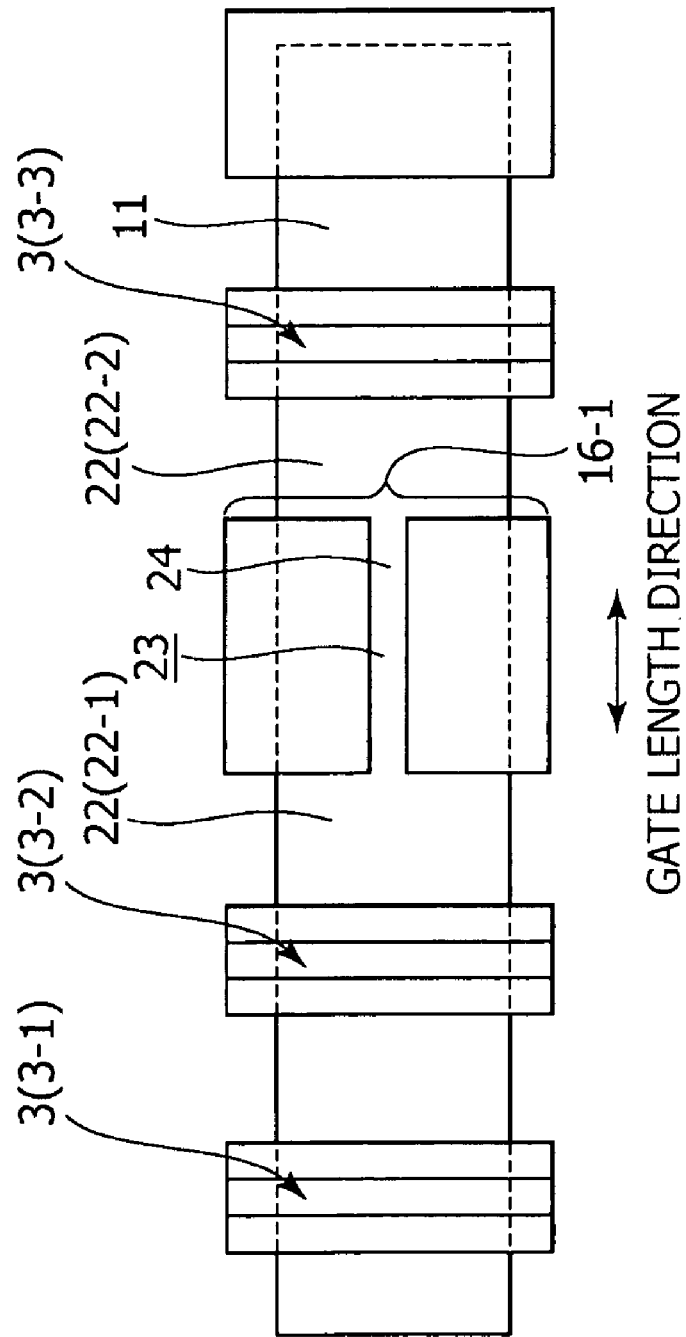
FIG. 4 is a plan view showing a layout of the semiconductor device according to one embodiment (third embodiment) of the present invention.
Figure 5:
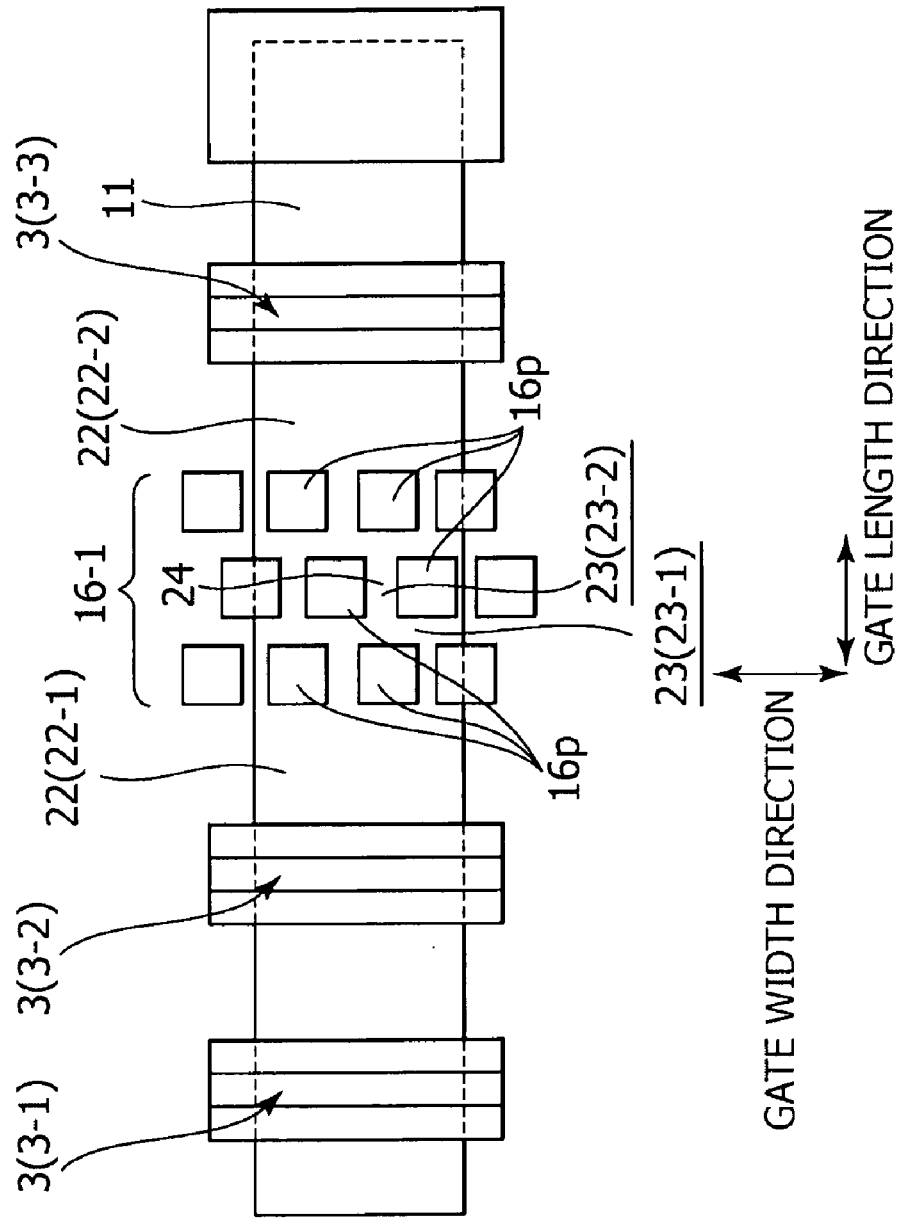
FIG. 5 is a plan view showing another layout of the semiconductor device according to one embodiment (third embodiment) of the present invention.

Next, further embodiment (third embodiment) of the semiconductor device according to an embodiment of the present invention will be explained, referring to FIG. 4 and FIG. 5 showing plan views of layout.

As shown in FIG. 4, the dummy pattern 16-1 explained in the first embodiment and the second embodiment has a slit 23 as deep as reaching the semiconductor substrate 11. The slit 23 is formed, for example, in the direction of gate length of the field effect transistors 3 (3-1, 3-2, 3-3).

By configuring the dummy pattern 16-1 having the slit 23 formed therein, a slit diffusion layer 24 formed by impurities introduced by ion implantation through the slit 23 into the semiconductor substrate 11, and the source/drain regions 22-1, 22-2 which are diffusion layers formed by impurities introduced by ion implantation from both sides of the dummy pattern 16-1 into the semiconductor substrate 11, are formed in a continuous pattern.

By virtue of this configuration, the source/drain regions 22-1,22-2 are electrically connected via the slit diffusion layer 24, so that the potential difference between the source/drain regions 22-1, 22-2 can be removed without connecting the both via an interconnect.

The potential difference between the source/drain regions 22-1, 22-2 can also be removed, when metal silicide layer (not shown) having a low resistivity is formed on the source/drain regions 22-1, 22-2, and on the slit diffusion layer 24.

Alternatively, as shown in FIG. 5, the dummy pattern 16-1 explained in the first embodiment and the second embodiment has a slit 23 as deep as reaching the semiconductor substrate 11. The slit 23 is formed, for example, in the direction of gate length of the field effect transistors 3 (3-1, 3-2, and 3-3). The slit 23 is, for example, composed of a first slit 23-1 extended in the direction of gate width of the field effect transistors 3 (3-1, 3-2, and 3-3), and a second slit 23-2 extended in the direction of gate length, so as to divide the dummy pattern 16-1 into a plurality of islands.

In an exemplary case shown in the drawing, the divided dummy patterns 16p neighboring in the direction of gate length are arranged so as to be shifted in the direction of gate width.

Although not shown in the drawing, the first slit 23-1 and the second slit 23-2 may be made in a lattice pattern.

Again although not shown in the drawing, the divided dummy patterns 16p neighboring in the direction of gate width may be arranged so as to be shifted in the direction of gate length.

In short, the slits 23 may be good enough if they are formed so as to connect the source/drain regions 22-1, 22-2 formed on both sides of the dummy pattern 16-1.

Thus, by forming the slit 23 in the dummy pattern 16-1 as described above, also the slit diffusion layer 24 composed of the diffusion layer same as that composing the source/drain regions 22-1, 22-2 may be formed in the semiconductor substrate 11 in the region over which the slit 23 is formed, in the process of forming the source/drain regions 22-1, 22-2 by ion implantation using the dummy pattern 16-1 as a mask, so that the source/drain regions 22-1,22-2 are consequently connected by the slit diffusion layer 24 under a state of electrically low resistivity.

As a consequence, the potential difference between the source/drain regions 22-1, 22-2 can be removed without connecting the both via interconnects.

When a metal silicide layer (not shown) having a low resistivity is formed on the source/drain regions 22-1,22-2, and on the slit diffusion layer 24, the potential difference between the source/drain regions 22-1,22-2 can further be removed by virtue of the metal silicide layers.

Next, an exemplary embodiment (fourth embodiment) of the semiconductor device of the present invention will be explained, referring to FIG. 6 which is a schematic sectional view showing a configuration thereof.

Figure 6:
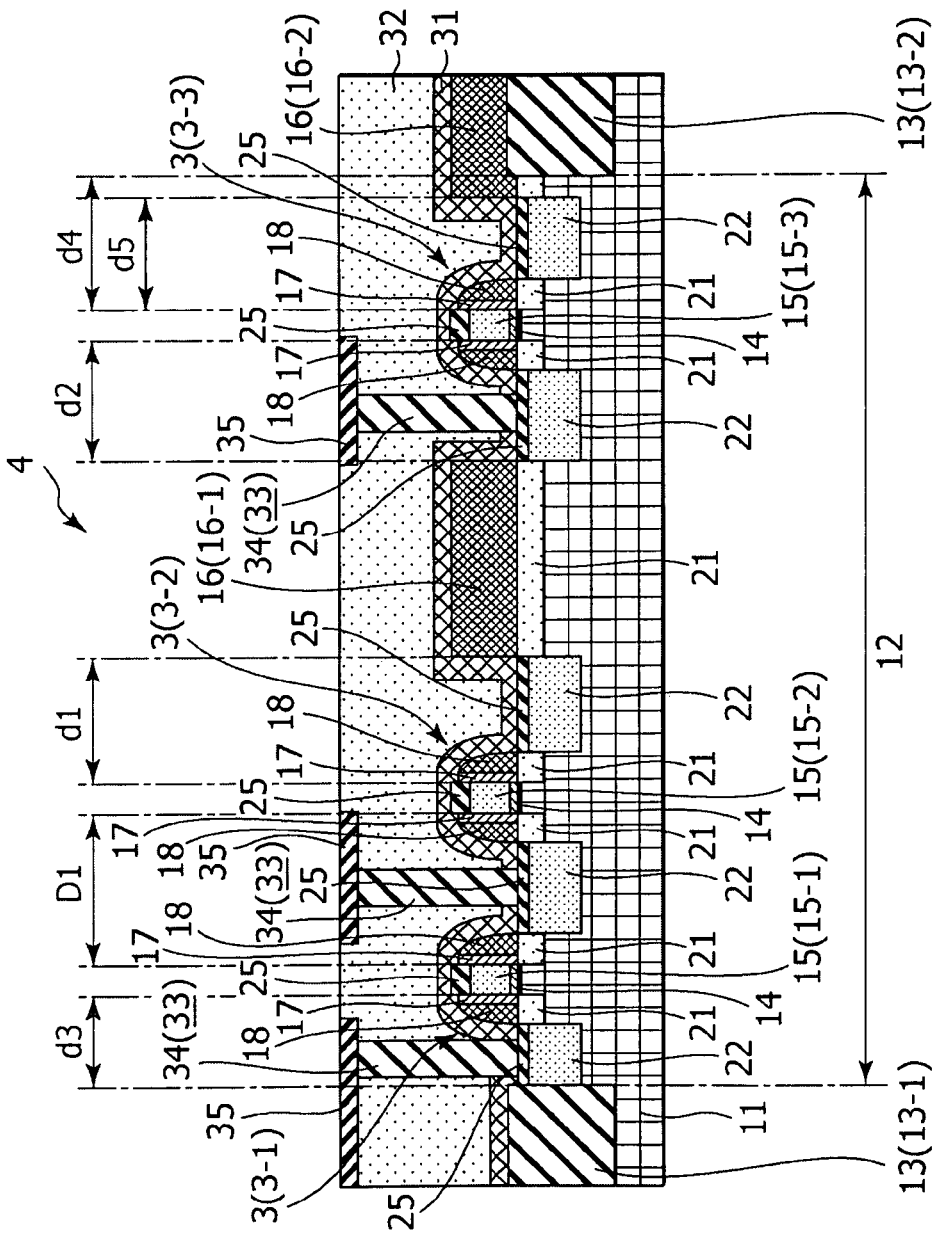
FIG. 6 is a schematic sectional view showing a configuration of the semiconductor device according to one embodiment (fourth embodiment) of the present invention.

As shown in FIG. 6, and as in the case of being explained by referring to FIG. 1, the element isolation regions 13 defining the active regions 12, are formed in the semiconductor substrate 11, and a plurality of field effect transistors 3 (3-1, 3-2, and 3-3) are formed in each active region 12.

More specifically, a plurality of gate electrodes 15 are formed on the active region 12 with the gate insulating film 14 interposed therebetween. Three gate electrode 15(15-1 to 15-3) are shown herein as an example. The plurality of gate electrodes 15 are formed, for example, so that the spacing D1 between the gate electrode 15 (15-1) and the gate electrode 15 (15-2) differs from the spacing D2 between the gate electrode 15 (15-2) and the gate electrode 15 (15-3).

In at least a part between the gate electrodes 15, which is between the gate electrode 15-2 and the gate electrode 15-3 herein, a dummy pattern 16 is formed.

The dummy pattern 16 is formed so that the spacing D1 between the gate electrode 15-1 and the gate electrode 15-2 which are adjacent to each other, the spacing d1 between the dummy pattern 16 (16-1) and the gate electrode 15-2 which is one of the adjacent gate electrodes, and the spacing d2 between the dummy pattern 16 (16-1) and the gate electrode 15-3 which is the other of the adjacent gate electrodes, are within the predetermined ranges.

Further, the spacing d3 between the element isolation region 13 (13-1) and the gate electrode 15-1, with respect to the spacing D1 between the gate electrodes, is within a predetermined range, whereas the spacing d4 between the gate electrode 15-3 and the element isolation region 13 (13-2) is not in the predetermined range.

For this reason, in order to make the spacing d4 fall in the predetermined range, the dummy pattern 16 (16-2) is formed to extend over the element isolation region 13 (13-2) while slightly overlapping the active region 12 on the element isolation region 13 (13-2) side thereof. Accordingly, the spacing d5 between the gate electrode 15-3 and the dummy pattern 16-2 with respect to the spacing D1 is be given as d5=D1, or d5=D1±δ.

The dummy pattern 16 (16-1) and the dummy pattern 16 (16-2) are made of an insulating film formed separately from the sidewalls 18 explained in the next, and therefore the thickness of which may be determined without being restricted by the thickness of the sidewall forming film for forming the sidewalls 18, so that they may be formed approximately to as high as the gate electrodes 15.

Sidewalls 18 are formed on each gate electrode 15 with an offset spacer 17 interposed therebetween. The gate electrodes 15 may have a hard mask layer 19 formed on the upper portion thereof. The formation of the hard mask layer 19 can prevent the gate electrodes 15 from being etched, when the offset spacers 17, the sidewalls 18 and the like are formed.

Source/drain regions 22, which are diffusion layers having impurities introduced therein by an impurity introducing technique such as ion implantation, are formed on the semiconductor substrate 11 on both sides of the respective gate electrodes 15 with LDD regions 21 therebetween.

On the semiconductor substrate 11, the etching stopper film 31 is formed to cover the gate electrodes 15 and the dummy pattern 16. The etching stopper film 31, composed of a silicon nitride film having a tensile stress, or composed of a silicon nitride film having a compressive stress, may be used also as a stress liner film for applying stress to channel regions formed in the semiconductor substrate 11 under the respective gate electrodes 15.

Further, on the semiconductor substrate 11, an insulating interlayer 32 is formed to cover the etching stopper film 31. Contact holes 33 (partially not shown) connecting to the source/drain regions 22, the gate electrodes 15 and the like are formed in the insulating interlayer 32. The drawing shows, as an example, the contact holes 33 connecting to the source/drain regions 22 on both sides of a part of dummy pattern 16-1. In the contact holes 33, plugs 34 are formed so as to fill the inside thereof. The plugs 34 are connected to the interconnects 35 formed on the insulating interlayer 32.

Since the spacing between the adjacent gate electrodes 15, and the spacing between the dummy pattern 16 and the gate electrodes 15 adjacent to the dummy pattern 15 are within predetermined ranges, and since the gate electrodes 15 and the dummy pattern 16 are formed almost equivalent in height, the fourth embodiment raises an advantage in that stress applied by the etching stopper film 31, which functions as a stress liner film, to portions of the semiconductor substrate 11 under the gate electrodes 15 may be equalized among the respective transistors.

Operations and effects similar to those explained in the first embodiment may be obtained also by the semiconductor device 4 of the fourth embodiment.

Next, one embodiment of the method of manufacturing a semiconductor device according to an embodiment of the present invention (first manufacturing method, the embodiment of this manufacturing method will be referred to as "first embodiment") will be explained, referring to FIG. 7A to FIG. 7E which are sectional views showing steps of manufacturing. In FIG. 7A to FIG. 7E, a method of manufacturing a configuration of the first embodiment of the semiconductor device is shown as an exemplary step.

As shown in FIG. 7A, the element isolation regions 13 defining the active regions 12 are formed in the semiconductor substrate 11. For example, a silicon substrate is used for the semiconductor substrate 11. The element isolation regions 13 may be formed, for example, by publicly-known STI (shallow trench isolation) technique.

For example, on the semiconductor substrate 11, a silicon oxide ($SiO_2$) film and a silicon nitride (SiN) film are deposited in this order by chemical vapor deposition (CVD), and then a resist pattern is formed thereon. Thereafter, the silicon nitride film, the silicon oxide film, and the semiconductor substrate 11 are etched (for example, by reactive ion etching (RIE)) in this order through the resist pattern used as a mask, to thereby form trenches destined for the element isolation regions. The trenches are as deep as approximately 300 nm. The trenches are filled up with an oxide-base film, and then the excessive portion of the oxide-base film deposited over the semiconductor substrate 11 is removed. The removal is conducted, for example, by chemical mechanical polishing (CMP). After necessary treatment with chemicals, the element isolation regions 13 are formed.

Next, although not shown in the drawing, the surface of the semiconductor substrate 11 is thermally oxidized, for example, to as thick as 10 nm, and through the thermal oxide film, an N-well region and a P-well region necessary for forming the semiconductor device are formed. For forming the N-well region, the P-well region is covered, for example, with a resist mask, and an impurity for forming the N-well region is implanted, whereas for forming the P-well region, the N-well region is covered, for example, with a resist mask, and an impurity for forming the P-well region is implanted. Impurities are also implanted into the channels so as to adjust the threshold voltage of nFET and pFET. Also in this case, similarly to the processes for forming the well regions, the threshold voltage of the nFET may be adjustable by covering the region, having the pFET formed therein, for example, with a resist mask, and an impurity is implanted therethrough, whereas the threshold voltage of the pFET may be adjustable by covering the region, having the nFET formed therein, for example, with a resist mask, and an impurity is implanted therethrough.

Next, as shown in FIG. 7B, a plurality of gate electrodes 15 are formed on the active region 12 of the semiconductor substrate 11 with the gate insulating film 14 interposed therebetween.

More specifically, the thermal oxide film is removed, and the gate insulating film 14 is formed by processes of thermal oxidation, nitridation and so forth. Films such as those composed of polysilicon, amorphous silicon or the like, are deposited to as thick as 100 nm to 200 nm or around, by CVD, for example.

Next, a resist is patterned thereon by lithography, and then the film composed of polysilicon or the like is etched by RIE through the patterned resist used as a mask, to thereby form the gate electrodes 15. In the 65-nm-node technology, minimum length of the gate electrodes 15 is approximately 30 nm to 50 nm.

The resist is then removed.

Next, the offset spacers 17 are formed on the side faces of each gate electrode 15. The offset spacers 17 are formed by forming an insulating film (not shown) over the entire surface of the semiconductor substrate 11 to cover the respective gate electrodes 15, and then etching back the insulating film.

For example, a TEOS (tetraethyl orthosilicate) film or a silicon nitride (SiN) film is deposited by CVD to as thick as 5 nm to 20 nm or around, and the offset spacers 17 are then formed on the side faces of the gate electrodes 15 by RIE in a self-aligned manner.

Next, an impurity is introduced into the surface layer of the semiconductor substrate 11, by using the gate electrodes 15, the offset spacers 17 and so forth as a mask, to thereby form the LDD regions 21 of the field effect transistors. As a method of introducing impurity, ion implantation is adaptable, for example.

In the process of forming the LDD regions 21, the ion implantation is followed by annealing for activating the impurity, if necessary.

Figure 7C:
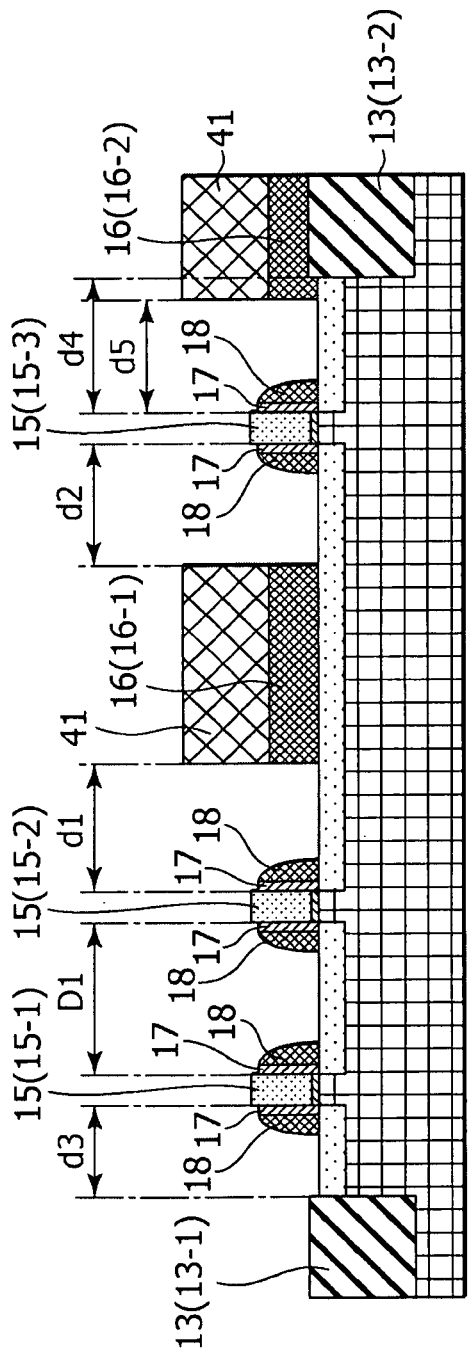

Next, as shown in FIG. 7C, the sidewalls 18 are formed on the side faces of each gate electrode 15 with the offset spacer 17 interposed therebetween. At the same time, for the purpose of making the spacing between every gate electrodes 15 fall in predetermined ranges, the dummy pattern 16 (16-1) is formed in the region where the adjacent gate electrodes 15 are widely apart, for example, between the gate electrode 15-2 and the gate electrode 15-3.

More specifically, the dummy pattern 16 (16-1) is formed so that the spacing D1 between the gate electrode 15-1 and the gate electrode 15-2 electrode which are adjacent to each other, the spacing d1 between the dummy pattern 16 (16-1) and the gate electrode 15-2 which is one of the adjacent gate electrodes, and the spacing d2 between the dummy pattern 16 (16-1) and the gate electrode 15-3 which is the other of the adjacent gate electrodes are within predetermined ranges.

Accordingly, the dummy pattern 16-1 is formed so as to satisfy relations of d1=D1 and d2=D1; d1=D1 and d2=D1±δ; d1=D1±δ and d2=D1; or d1=D1±δ and d2=D1±δ.

If the spacing d3 between the element isolation region 13 (13-1) and the gate electrode 15-1 falls in a predetermined range with respect to the spacing D1 between the gate electrodes 15-1 and 15-2, but the spacing d4 between the gate electrode 15-3 and the element isolation region 13 (13-2) is not within the predetermined range, now in order to make the spacing d4 fall in the predetermined range, the dummy pattern 16 (16-2) is formed so as to extend over the element isolation region 13 (13-2) while slightly overlapping the active region 12 on the element isolation region 13 (13-2) side thereof.

Accordingly, the spacing d5 between the gate electrode 15-3 and the dummy pattern 16-2 with respect to the spacing D1 is given as d5=D1, or d5=D1±δ.

In order to form the sidewalls 18 and the dummy pattern 16 as described above, the sidewall forming film (not shown) is formed on the semiconductor substrate 11 to cover the gate electrodes 15, the offset spacers 17 and so forth.

The sidewall forming film is formed by depositing, for example, TEOS, silicon nitride (SiN), borosilicate glass (BSG), phosphosilicate glass (PSG), and the like by CVD to as thick as 10 nm to 100 nm. The insulating film is configured as a stacked film combining two or more species thereof.

Next, an etching mask 41 is formed on the sidewall forming film in the region where the dummy pattern 16 is formed. The etching mask 41 is formed by general resist coating technique and lithographic technique. In this process, the etching mask 41 is formed at a position allowing the spacing between the gate electrodes 15 and the dummy pattern 16 to obtain the above described spacing.

The sidewall forming film is then etched back. As a consequence, the sidewalls 18 are formed on the side faces of the respective gate electrodes 15 to sandwich the offset spacers 17, and by the sidewall forming film, also the dummy pattern 16 is formed at the same time.

The etching mask 41 is then removed.

Figure 7D:
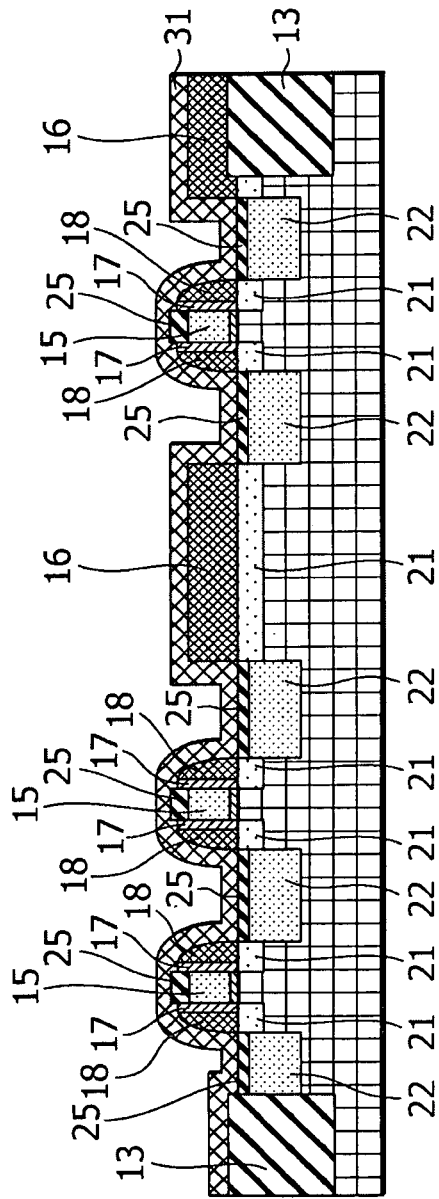

Next, as shown in FIG. 7D, the source/drain regions 22 are formed by introducing impurities into the semiconductor substrate 11 using the respective gate electrodes 15, the offset spacers 17, the sidewalls 18, the dummy pattern 16, and element isolation regions 13 and so forth as a mask, followed by annealing, to thereby form diffusion layers. In this way, the source/drain regions 22 are formed on both sides of the respective gate electrode 15 with the LDD regions 21 therebetween.

Next, a metal layer for forming a metal silicide is formed on the semiconductor substrate 11, so as to cover the respective gate electrodes 15, the offset spacers 17, the sidewalls 18, the dummy pattern 16, the element isolation regions 13 and so forth. Next, a metal of the metal layer is subjected to the thermal reaction with silicon composing the gate electrodes 15, the source/drain regions 22 and so forth by annealing, to thereby form the metal silicide layers 25.

Thereafter, the unreacted portion of the metal layer is removed.

In this way, the metal silicide layers 25 are formed only on the gate electrodes 15 and the source/drain regions 22 in a self-aligned manner.

More specifically, as an example, a metal film capable of reacting with silicon (Si) to produce metal silicide, which may be exemplified by metal films, for example, composed of nickel (Ni), nickel platinum (NiPt) alloy, cobalt (Co) and the like, is formed on the semiconductor substrate 11 so as to cover the gate electrodes 15 and the source/drain regions 22, for example, as thick as 5 nm to 15 nm. The metal film is formed by sputtering, for example.

The metal of the metal film is subjected to the thermal reaction at 400° C. to 600° C., to thereby form the metal silicide layers 25 in a self-aligned manner only in the portions where silicon and the metal film are brought into contact.

Next, the etching stopper film 31 is formed on the semiconductor substrate 11 so as to cover the gate electrodes 15 (containing the metal silicide layers 25), the offset spacer 17, the sidewalls 18, the dummy pattern 16, the source/drain regions 22 (containing the metal silicide layers 25), the element isolation region 13 and so forth. The etching stopper film 31 is used as a stress liner film for applying stress to the channel regions formed in the semiconductor substrate 11 under the respective gate electrodes 15, and the film in this case may be formed by a silicon nitride film having a tensile stress, or by a silicon nitride film having a compressive stress.

For example, a silicon nitride film having a tensile stress is formed for n-channel field effect transistors, and a silicon nitride film having a compressive stress is formed for p-channel field effect transistors.

The silicon nitride films having tensile stress and compressive stress may be formed by selecting conditions of film making in chemical vapor deposition (CVD).

The silicon nitride films are formed, for example, to as thick as 30 nm to 100 nm or around. The etching stopper film 31 is formed herein to the thickness described in the above, because it functions as once terminating the etching in the process of formation of the contact holes, but is removed in the succeeding etching specifically in the portions thereof exposed in the contact holes.

In other words, the thickness is determined as approximately 30 nm or larger in view of ensuring termination of the etching, and as approximately 100 nm or smaller in view of readiness in removal in the succeeding etching, or in view of shrinkage of the spacing between the gates and the contacts.

For the case where the film is used also as the stress liner film, the thickness is selected so that the film appropriately applies the stress within the above-described range of thickness.

Figure 7E:
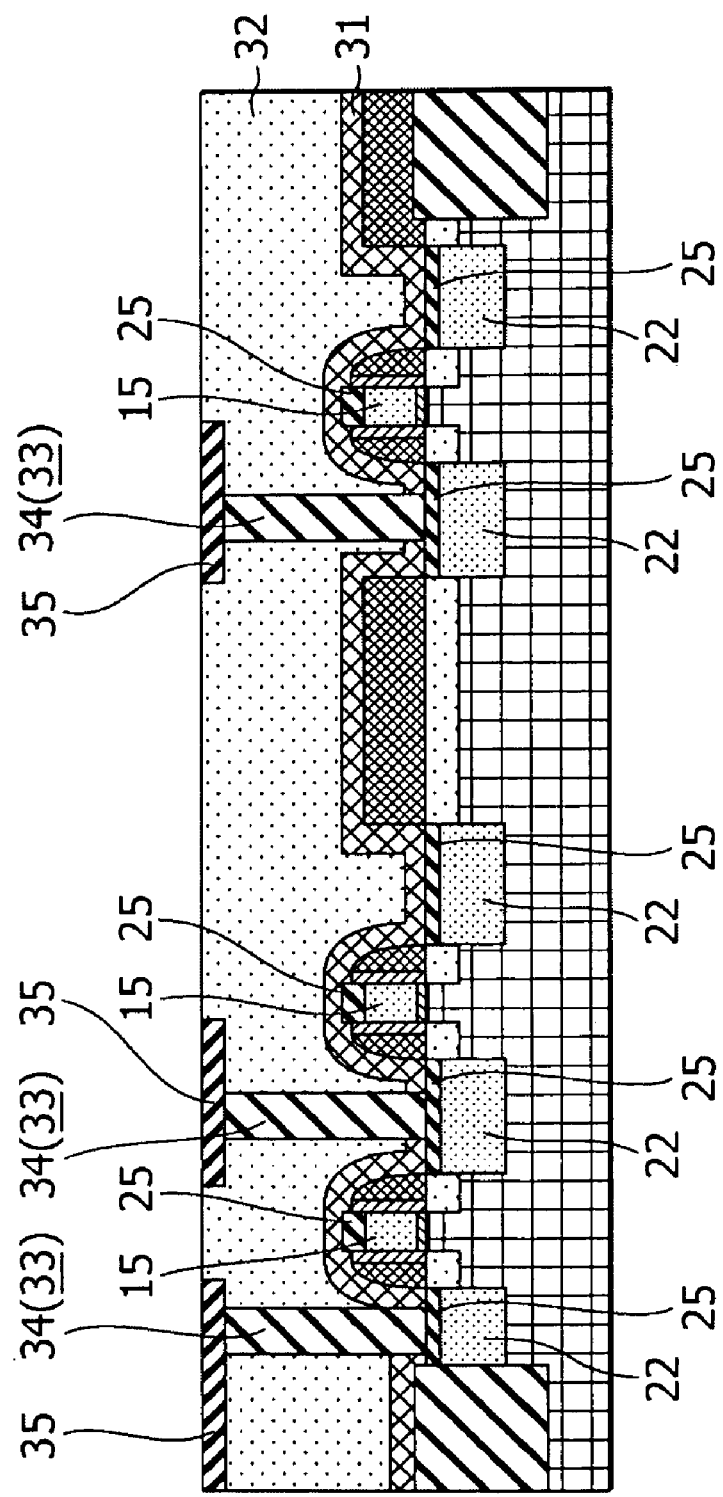
Figure 9:
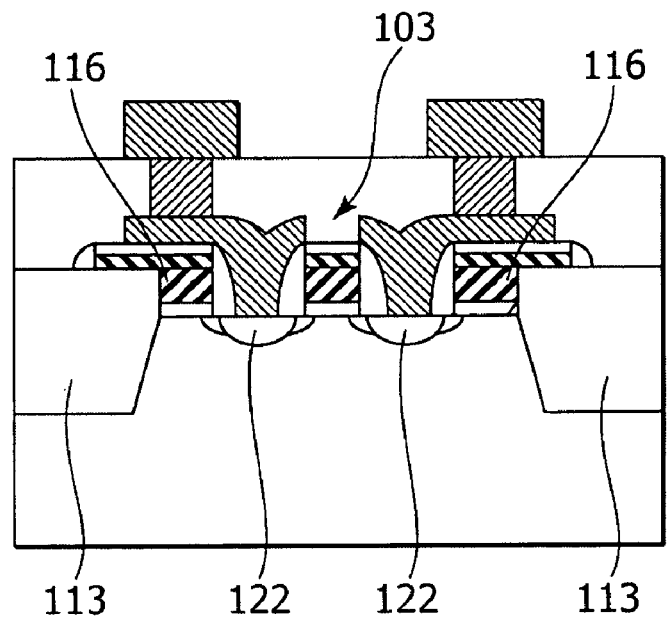
FIG. 9 is a schematic sectional view showing an example of a known technique.
Figure 10:
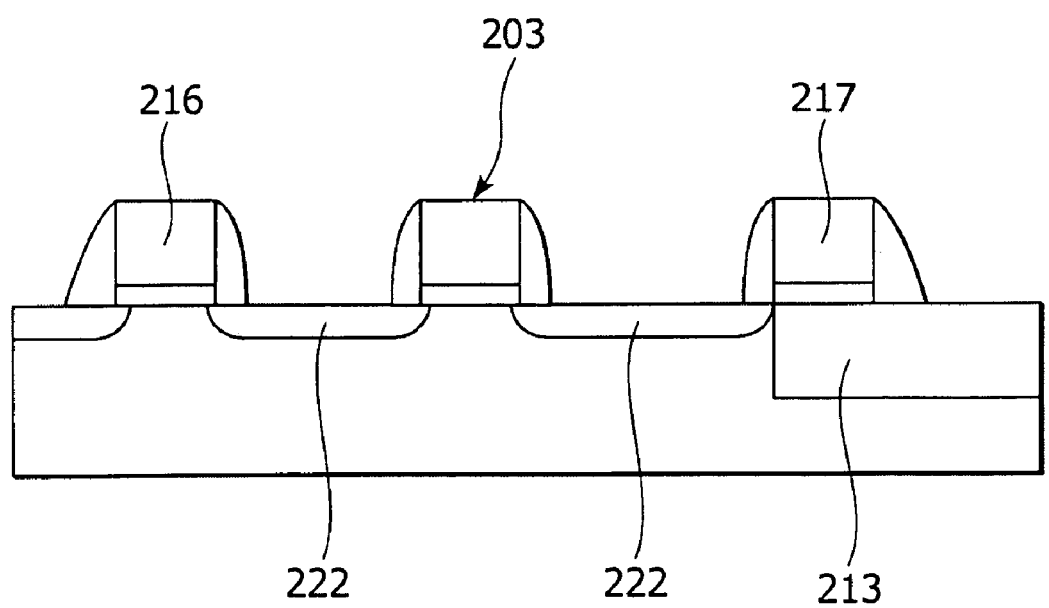
FIG. 10 is a schematic sectional view showing an example of a known technique.
Figure 11:
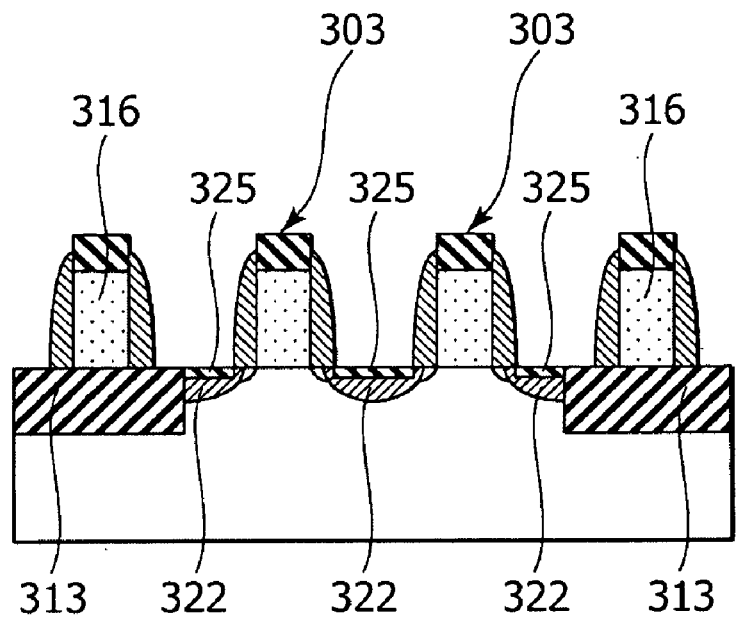
FIG. 11 is a schematic sectional view showing an example of a known technique.
Figure 12:
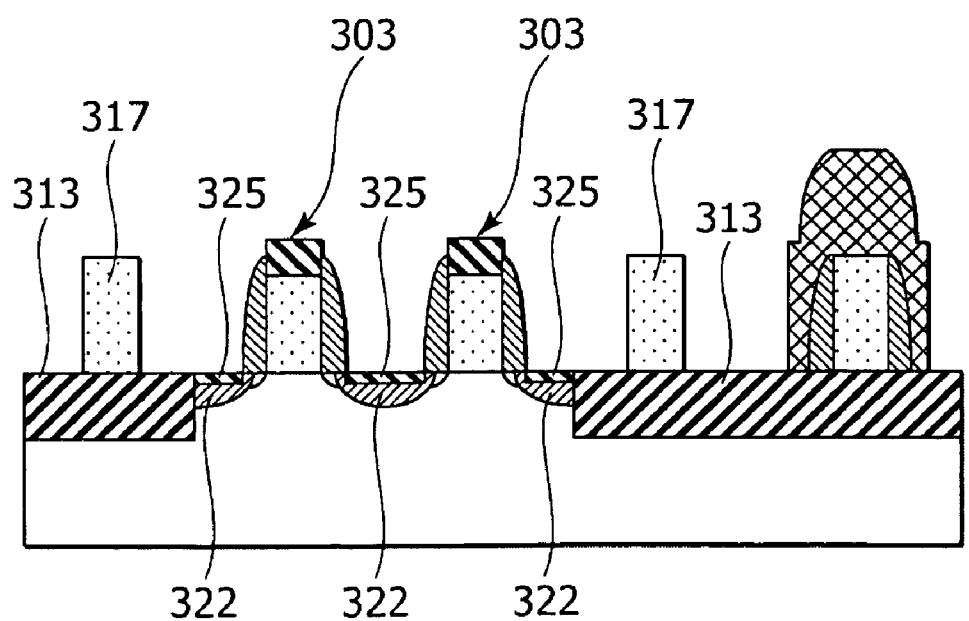
FIG. 12 is a schematic sectional view showing an example of a known technique.

Next, as shown in FIG. 7E, the insulating interlayer 32 is formed on the semiconductor substrate 11 to cover the etching stopper film 31.

The insulating interlayer 32 is, for example, composed of a silicon oxide-base film, and more specifically an oxide film such as non-doped silicate glass (NSG) film, TEOS film, high-density-plasma (HDP) oxide film, and is formed, for example, by chemical vapor deposition (CVD). The thickness may preferably be adjusted so as to make the surface level thereof higher than that of the gate electrodes 15. For example, the insulating interlayer 32 preferably has an initial thickness capable of leaving 100-nm to 500-nm-thick film after the surface thereof is planarized by a planarization technique such as chemical mechanical polishing (CMP).

The insulating interlayer 32 may be formed also using so-called, low-k film, having a dielectric constant smaller than that of silicon oxide. Embodiments of the low-k film include organic low-k films such as polyarylether and polyimide resins, and inorganic low-k films such as porous insulator exemplified by porous silica, and silicon carbon oxide.

Next, the contact holes 33 are formed in the insulating interlayer 32 by publicly-known lithographic technique and etching technique, so as to reach the metal silicide layers 25 on the source/drain regions 22, the metal silicide layers 25 on the gate electrodes 15 and so forth. The drawing exemplarily shows the contact holes 33 reaching the metal silicide layers 25 on a part of the source/drain regions 22.

Next, an electroconductive material is filled to fill up the contact holes 33. For example, tungsten (W) is filled by using a titanium (Ti) film as an adhesive layer. The tungsten (W) film is formed by chemical vapor deposition, for example.

Next, the excessive electroconductive film deposited on the insulating interlayer 32 is removed, and the plugs 34 are then formed using the portion of the electroconductive film remained in the contact holes 33. Removal of the electroconductive film is carried out by chemical mechanical polishing (CMP), or etchback.

Next, an interconnect layer is formed on the insulating interlayer 32, and the interconnect layer is then processed by publicly-known lithographic technique and etching technique, to thereby form the interconnects connected to the plugs 34.

The interconnects 35 are formed with an interconnect material such as aluminum (Al), copper (Cu) or the like.

Although not shown in the drawing, a multi-layered interconnect is formed by repeating these steps of forming the interconnects, to thereby form the semiconductor device 1.

Although the explanation in the above dealt with an exemplary case where a plurality of field effect transistors 3 are formed in a single active region 12, another exemplary case may be such that the semiconductor substrate 11 has a plurality of active regions 12, wherein a plurality of n-channel field effect transistors (nFETs) are formed in a single active region 12 and a plurality of p-channel field effect transistors (pFETs) are formed in another active region 12, When the LDD regions and the source/drain regions of the nFETs are formed in this configuration, the pFET forming region is masked, for example, by resist, and conversely when the LDD regions and the source/drain regions of the pFETs are formed, the nFET forming region is masked, for example, by resist. The technique is similar to the masking technique adopted when general CMOS transistors are formed.

Alternatively, for the case where the source/drain region 22-1 and the source/drain region 22-2 on both sides of the dummy pattern 16-1 are connected by the interconnect 35, similarly to as in the second embodiment of the semiconductor device, a mask adoptable for the process of forming the interconnects 35 is such as allowing formation of the interconnect connecting the plugs 34 respectively connected to the source/drain regions 22-1, 22-2.

Alternatively, for the case where the slits 23 are formed in the dummy pattern 16 as described in the third embodiment of the semiconductor device, the mask having slits formed therein may be used as the mask used for forming the dummy pattern 16.

In the first embodiment of the method of manufacturing a semiconductor device, the etching mask 41 is formed so that the spacing D1 between the gate electrode 15-1 and the gate electrode 15-2 electrode which are adjacent to each other, and the respective spacings d1 and d2 between the dummy pattern 16 (16-1) and the gate electrodes 15-2 and 15-3 may consequently fall in predetermined ranges, and the dummy pattern 16-1 is formed using thus-obtained etching mask 41, thereby the spacing D1 between the gate electrode 15-1 and the gate electrode 15-2 electrode which are adjacent to each other, and the respective spacings d1 and d2 between the dummy pattern 16 (16-1) and the gate electrodes 15-2 and 15-3 fall in the predetermined ranges.

Accordingly, effects described below will be obtained if the etching stopper film 31 or the like, intended for applying stress to the source/drain regions 22, the metal silicide layers 2 and the semiconductor substrate 11, is formed on between the gate electrodes 15-1 and the gate electrode 15-2, and between the dummy pattern 16 and each of the gate electrode 15-2 and the gate electrode 15-3.

Because the regions where impurities for forming the source/drain regions 22 are to be introduced, or in other words, the region between the gate electrodes 15-1 and the gate electrode 15-2, the region between the dummy pattern 16-1 and each of the adjacent gate electrode 15-2 and the gate electrode 15-3, the region between the gate electrode 15-1 and the element isolation region 13-1, and the region between the gate electrode 15-3 and the dummy pattern 16-2, can be kept fallen within the predetermined ranges, amount of point defect possibly produced in the source/drain regions 22 composed of diffusion layers can be kept at a constant level.

Furthermore, the thickness of the metal silicide layers 25 formed on the source/drain regions 22 can be made uniform.

Consequently, a variation in transistor characteristics ascribable to the gate spacing can be suppressed.

In the most advanced LSIs, when the stress liner film having tensile stress or compressive stress is used with the aim of improving transistor characteristics, it has been known that stress applied by the stress liner film may vary depending on the gate spacing, so that the transistor characteristics may also vary due to such stress variation.

However, according to the first embodiment of the method of manufacturing, the region between the gate electrode 15-1 and the gate electrode 15-2, the region between the dummy pattern 16-1 and the adjacent gate electrode 15-2 and the gate electrode 15-3 each of which is adjacent to the dummy pattern 16-1, the region between the gate electrode 15-1 and the element isolation region 13-1, and the region between the gate electrode 15-3 and the dummy pattern 16-2 may be kept fallen within the predetermined ranges, so that the gate-spacing-dependent variation in stress applied by the etching stopper film 31 may be suppressed, so that the variation in transistor characteristics ascribable to the stress variation may also be suppressed.

Since the LDD region 21 is formed under the dummy pattern 16-1, electrical element isolation necessary for the known method of using the dummy pattern may be avoidable, and therefore the dummy pattern 16 of the present embodiment may be applied to anywhere in the active region 12 between any gate electrodes 15.

Next, another embodiment of the method of manufacturing a semiconductor device according to an embodiment of the present invention (second method of manufacturing) (embodiment of this method of manufacturing will be referred to as "second embodiment") will be explained, referring to FIGS. 8A and 8B which are sectional views showing steps of manufacturing. In FIGS. 8A and 8B, as an example, a method of manufacturing a configuration of the fourth embodiment of the semiconductor device is shown.

In the method of manufacturing according to the second embodiment, unlike the first embodiment, only the sidewalls 18 are formed using the sidewall forming film, but the dummy pattern 16 is not formed. Alternatively, the dummy pattern 16 is formed after the sidewalls 18 are formed, by forming another insulating film on the semiconductor substrate 11, and then patterning the insulating film by lithographic technique and etching technique.

Therefore, other processes are similar to those in the first embodiment.

More specific explanation will be given below.

As shown in FIG. 8A, similarly to as described in the first embodiment, the sidewalls 18 are formed on the side faces of the gate electrodes 15 formed on the semiconductor substrate 11 with the gate insulating film 14 therebetween, with the offset spacers 17 interposed therebetween.

More specifically, the element isolation regions 13 are formed on the semiconductor substrate 11 to partition the active regions 12. The element isolation region 13 may be formed, for example, by publicly-known STI (shallow trench isolation) technique.

Next, a plurality of gate electrodes 15 are formed on the active regions 12 of the semiconductor substrate 11 with the gate insulating film 14 therebetween.

Next, the offset spacers 17 are formed on the side faces of the respective gate electrodes 15. The offset spacers 17 is be formed by forming an insulating film (not shown) over the entire surface of the semiconductor substrate 11 to cover the respective gate electrodes 15, and then etching back the resultant insulating film.

Next, impurities are introduced into the semiconductor substrate 11 by using the gate electrodes 15, the offset spacers 17 and the like as a mask, to thereby form the LDD regions 21 of the field effect transistor. For example, on implantation is used to the introduction of impurities.

Next, the sidewalls 18 are formed on the side faces of the respective gate electrodes 15 with the offset spacers 17 therebetween.

Next, as shown in FIG. 8B, for the purpose of making the spacings between the adjacent gate electrodes 15 fall within predetermined ranges, the dummy pattern 16 (16-1) is formed in the region where the adjacent gate electrodes 15 are widely apart, for example between the gate electrode 15-2 and the gate electrode 15-3. At the same time, the dummy pattern 16 (16-2) is formed to extend over the element isolation region 13 (13-2) while slightly overlapping the active region 12 on the element isolation region 13 (13-2) side thereof.

To form the dummy patterns 16, first, an insulating film (not shown) is formed on the semiconductor substrate 11, to cover the gate electrodes 15, the offset spacers 17, the sidewalls 18 and the like.

As the insulating film, a film of TEOS, silicon nitride (SiN), borosilicate glass (BSG), phosphosilicate glass (PSG) or the like is be formed, for example, by CVD, so as to make the surface level thereof equivalent to that of the gate electrodes 15. The insulating film may be configured as a stacked film combining two or more species thereof.

Next, the etching masks 41 are formed on the insulating film in the region where the dummy patterns 16 is formed. The etching masks 41 are formed by general resist coating technique and lithographic technique. At this time, the etching masks 41 are formed at positions so that the spacing between the gate electrodes 15 and the dummy patterns 16 is obtained as explained below.

More specifically, the etching mask 41 (41-1) is formed so as to make the spacing D1 between the gate electrode 15-1 and the gate electrode 15-2 which are adjacent to each other, the spacing d1 between the dummy pattern 16 (16-1) formed later and one adjacent gate electrode 15-2, and the spacing d2 between the dummy pattern 16 (16-1) and the other adjacent gate electrode 15-3 may consequently be within predetermined ranges.

Accordingly, the etching mask 41 (41-1) is formed so as to make the dummy pattern 16-1 formed later satisfy relations of d1=D1 and d2=D1; d1=D1 and d2=D1±δ; d1=D1±δ and d2=D1; or d1=D1±δ and d2=D1±δ.

If the spacing d3 between the element isolation region 13 (13-1) and the gate electrode 15-1 is within a predetermined range with respect to the spacing D1 between the gate electrodes 15-1, 15-2, but the spacing d4 between the gate electrode 15-3 and the element isolation region 13 (13-2) is not within the predetermined range, now in order to make the spacing d4 fall within the predetermined range, also an etching mask 41 (41-2) is formed in order to form the dummy pattern 16 (16-2) so as to extend over the element isolation region 13 (13-2) while slightly overlapping the active region 12 on the element isolation region 13 (13-2) side thereof.

Accordingly, the spacing d5 between the gate electrode 15-3 and the dummy pattern 16-2 with respect to the spacing D1 is given as d5=D1, or d5=D1±δ.

The insulating film is then etched through the etching masks 41. As a consequence, the dummy patterns 16 are formed so as to make the spacing between each of the adjacent gate electrodes fall within the predetermined ranges.

The etching masks 41 are then removed.

The steps after the formation of the dummy patterns 16 may be similar to those explained in the first embodiment. More specifically, the steps shown in FIG. 7D and FIG. 7E may be carried out.

According to the method of manufacturing of the second embodiment, not only operations and effects obtainable from the method of manufacturing of the first embodiment, but also the operations and effects described in the next may be obtained.

Since the dummy patterns 16 are formed without using the sidewall forming film, the thickness of which has otherwise been restricted by width of the sidewalls 18, instead by using a separately-obtained insulating film, so that the height of the dummy patterns 16 can arbitrarily be set.

For example, the spacings between the adjacent gate electrodes 15, and between each of the gate electrodes 15 and the dummy patterns 16 may occasionally vary within an allowable range. The variation may occur in a range of ±δ.

In such a case, the embodiment makes it easier to keep the stress applied by the etching stopper film 31 at a predetermined level, irrespective of the spacings between the adjacent gate electrodes 15, and between each of the gate electrodes 15 and the dummy patterns 16. In other words, it is made easier to achieve the height of the dummy pattern 16 to keep the stress applied by the etching stopper film 31 constant.

For example, by setting the height of the dummy patterns 16 equivalent to that of the gate electrodes 15, the stress applied by the etching stopper film 31 may be kept approximately at a constant level, even if the spacings between the adjacent gate electrodes 15, and between each of the gate electrodes 15 and the dummy patterns 16 may vary within a predetermined allowable range.

The present invention is not limited to the case of having three field effect transistors (in other words, the number of gate electrodes) formed in the active region, but may be applicable to any other number of transistors of two or larger.

The spacing between the adjacent gate electrodes 15, and the spacing between each of the gate electrodes 15 and the dummy pattern(s) 16 adjacent to the gate electrodes 15 in the individual embodiments described in the above, may be adjusted to 100 nm to 500 nm or around, depending on the generation of field effect transistors. With reference to the spacing between the gate electrodes 15 keeping the narrowest spacing in between (the gate electrode 15-1 and the gate electrode 15-2 in the first embodiment) as a reference spacing, the dummy pattern(s) 16 may preferably be formed in the region between the gate electrodes 15 keeping a spacing wider than the reference spacing in between.

However, it is noted that, for the case where the dummy pattern 16 is formed using publicly-known lithographic technique and etching technique, width of the dummy pattern 16 will necessarily have the width not smaller than the minimum rule of patterning.

It is, therefore, a matter of course that the dummy pattern 16 having the width smaller than the minimum rule of patterning is not be formed.

Consequently, δ appeared in the above-described relations may be defined also as the width on the basis of the minimum rule of patterning in the process of forming the dummy pattern(s) 16.

It is noted that the specific forms and structures of the various parts and the numeric values indicated in each of the embodiments and the above numeral embodiments are merely given as embodiments for implementation of embodiments of the present invention. It is therefore to be understood that the technical scope of the present invention should in no way be limited by the above.

What is claimed is:

1. A semiconductor device comprising:
   a semiconductor substrate having an active region and an isolation region;
   at least first, second and third gate electrodes on the substrate within the active region with a gate insulating film interposed therebetween; and
   a dummy pattern formed within the active region in at least a part thereof between the second and third gate electrodes,
   wherein,
   the distance between the first and second gate electrodes is D1,
   the distance between the second and third gate electrodes is D2,
   the distance between the second gate electrode and the dummy electrode is d1,
   the distance between the dummy electrode and the third gate electrode is d2
   the distance between the isolation region and the first gate electrode is d3,
   the distance between the third gate electrode and the isolation region is d4,
   D1 is not equal to D2,
   d2 is equal to D1 plus a tolerance value, and
   when D1 is not equal to d3 or D1 is not equal to d4, then d3 is equal to D1 plus the tolerance value, but d4 is not equal to d3.

2. The semiconductor device as claimed in claim 1, wherein the dummy pattern is composed in part of a sidewall forming film used for forming sidewalls on side faces of the gate electrodes.

3. The semiconductor device as claimed in claim 1, further comprising a stress liner film cover the gate electrodes and the dummy pattern which applies a stress to the semiconductor substrate.

4. The semiconductor device as claimed in claim 1, comprising diffusion layers formed in the semiconductor substrate at both sides of the dummy pattern and which are connected to each other via an interconnect.

5. The semiconductor device as claimed in claim 1, wherein the dummy pattern has a slit as deep as reaching the semiconductor substrate.

6. The semiconductor device as claimed in claim 1, wherein the dummy pattern is composed of an insulating film different from the sidewall forming film on the gate electrodes.

* * * * *